(12) United States Patent
Chang

(10) Patent No.: US 7,545,666 B2
(45) Date of Patent: Jun. 9, 2009

(54) ELECTRICAL FUSE SELF TEST AND REPAIR

(75) Inventor: Chingwen Chang, Taipei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 26 days.

(21) Appl. No.: 11/939,982

(22) Filed: Nov. 14, 2007

(65) Prior Publication Data
US 2009/0122589 A1    May 14, 2009

(51) Int. Cl.
*G11C 17/16* (2006.01)
(52) U.S. Cl. ............... 365/96; 365/189.02; 365/201; 365/225.7
(58) Field of Classification Search ............... 365/96
See application file for complete search history.

(56) References Cited
U.S. PATENT DOCUMENTS
6,151,238 A * 11/2000 Smit et al. ............. 365/96

6,292,422 B1 * 9/2001 Pitts ............. 365/225.7
6,754,113 B2 * 6/2004 Ma et al. ............. 365/200

* cited by examiner

*Primary Examiner*—Tan T. Nguyen
(74) *Attorney, Agent, or Firm*—K & L Gates LLP

(57) ABSTRACT

A circuit for testing and repairing a fuse device having a plurality of fuse units and being able to serially input and output data is disclosed, the circuit comprises a first multiplexer configured to select either a true or an inverted data for being stored in the fuse device, a second multiplexer configured to select either a true or an inverted data being read out from the fuse device, a storage unit configured to store information of faulty fuse units, and an indication bit being programmed to reflect a comparison between the data intended to be stored in the fuse device and the stored faulty unit information, wherein when the indication bit is at a first state, the first and second multiplexers select the true data, and when the indication bit is at a second state, the first and second multiplexers select the inverted data.

18 Claims, 4 Drawing Sheets

ELECTRICAL FUSE SELF TEST AND REPAIR

BACKGROUND

The present invention relates generally to electrical fuse circuit designs, and more particularly to designing a self test and repair module for the electrical fuse circuit.

Electrical fuse is a convenient logic nonvolatile memory for permanently holding information such as "chip-ID", etc. A typical implementation is a laser-fuse, where laser energy is used to program the fuse by evaporating metal or polysilicon links and the resulting resistance change is sensed using a latch. However, pitches of the laser-fuse device are not scalable below the wavelength of the laser beam, typically 1.06 um, thus the laser-fuse is not suitable for deep submicron technologies.

To overcome the laser-fuse's pitch limitation, an electrical fuse, typically made of silicided polysilicon, uses electrical current instead to program. When programming the electrical fuse, a high current density, typically 600 $mA/um^2$ for the silicided polysilicon, is applied to the electrical fuse link for a certain period of time. The resistance of the electrical fuse will rise due to the electrical stress in its fuse link. A few micro seconds of stress may be a long enough time to cause a discernable resistance change, ideally more than 1 Kohm, in the electrical fuse.

Since electrical fuse exhibits no visible signs of change after being programmed. Testing of the electrical fuse under program can only be performed electrically. A conventional method is to test the electrical fuse on an automatic test equipment (ATE). However, spending test time on the ATE will increase the cost of manufacturing the integrated circuit (IC) that contains the electrical fuse. Besides, the ATE can not perform any repair if a faulty electrical fuse is encountered. Such an IC chip will be discarded for the faulty electrical fuse even if the main circuit performs perfectly. This lack of reparability will affect product yield and increase the overall cost of manufacturing the IC chip.

As such, what is desired is an electrical fuse circuit that can be easily tested and repaired after being programmed.

SUMMARY

In view of the foregoing, the present invention provides a circuit for testing and repairing a fuse device having a plurality of fuse units and being able to serially input and output data. According to one aspect of the present invention, the circuit comprises a first multiplexer configured to select either a true or an inverted data for being stored in the fuse device, a second multiplexer configured to select either a true or an inverted data being read out from the fuse device, a storage unit configured to store information of faulty units of the plurality of the fuse units, and an indication bit being programmed to reflect a comparison between the data intended to be stored in the fuse device and the stored faulty unit information, wherein when the indication bit is at a first state, the first and second multiplexers select the true data, and when the indication bit is at a second state, the first and second multiplexers select the inverted data.

According to another aspect of the present invention, both the plurality of fuse unit and the indication bit are electrically programmable fuses.

According to yet another aspect of the present invention, the faulty unit's location and logic state information are stored and later compared with data intended to be stored in the fuse device.

The construction and method of operation of the invention, however, together with additional objects and advantages thereof will be best understood from the following description of specific embodiments when read in connection with the accompanying drawings.

BRIEF DESCRIPTION OF THE DRAWINGS

The present invention is illustrated by way of example, and not by way of limitation, in the figures of the accompanying drawings in which like reference numerals refer to similar elements.

DESCRIPTION

The following will provide a detailed description of a system and method for constructing an electrical fuse device that can be self tested and repaired in case of faulty bits.

Figure 1:
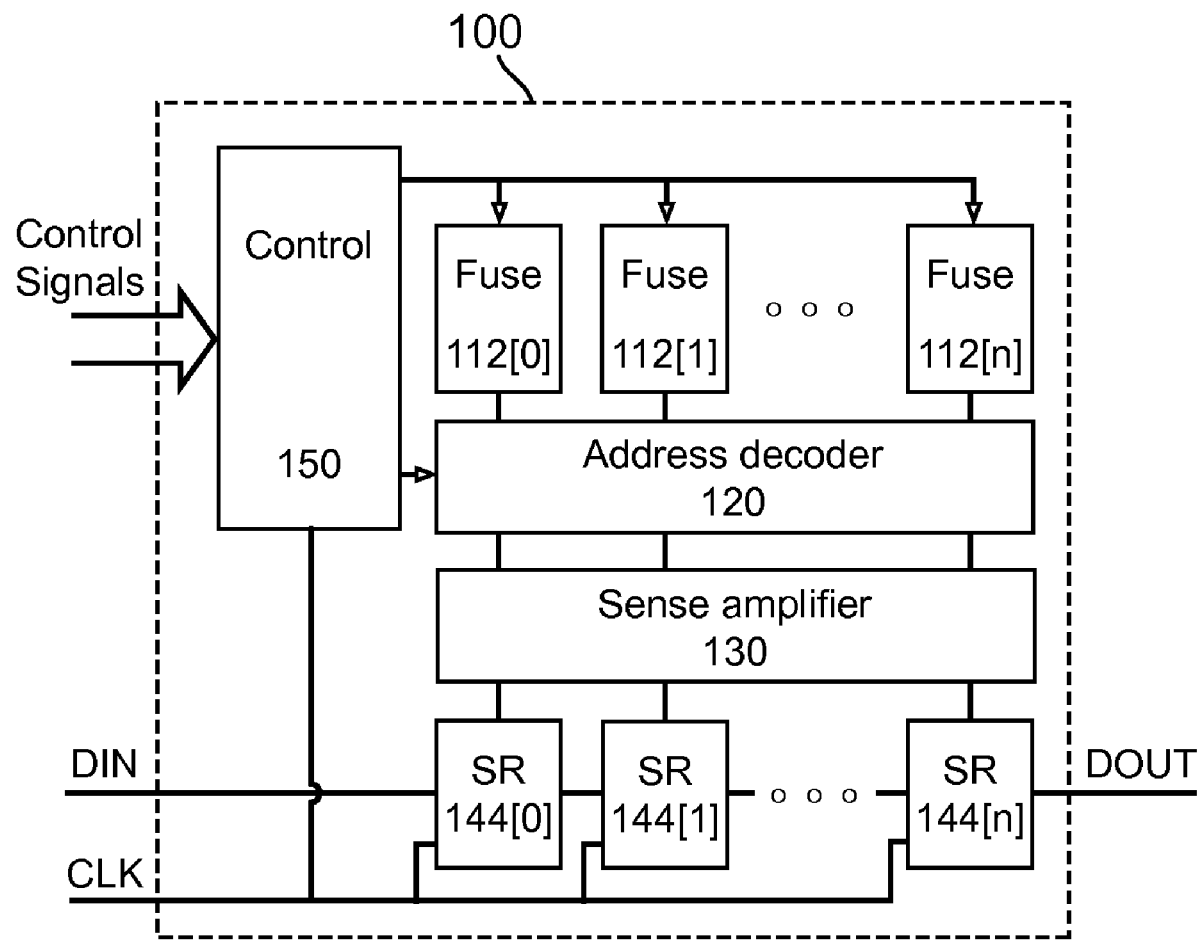
FIG. 1 is a block diagram illustrating a conventional electrical fuse macro.

FIG. 1 is a block diagram illustrating a conventional electrical fuse macro 100. The conventional electrical fuse macro 100 comprises a plurality of electrical fuses 112[0:n], an address decoder 120, a sense amplifier module 130, a plurality of shift registers 144[0:n], and a control unit 150. The address decoder 120 is used to select one out of the plurality of electrical fuses 112[0:n] for either programming or read out. Before being programmed, the fuses 112[0:n] have low resistances. After being programmed, the fuse resistances rise significantly to be detected by the sense amplifier module 130. The sense amplifier module 130 detects the fuse resistances by comparing the fuse resistances with a known resistor (not shown), and produces a logic 0 when a fuse is not programmed, and a logic 1 when a fuse is programmed, or vice versa depending on how the inputs of the sense amplifier module 130 are arranged. The detected logic states of the electrical fuses 112[0:n] will be stored in the plurality of shift registers 144[0:n], respectively. The plurality of shift registers 144[0:n] are serially connected, and a clock signal CLK can cause the data to shift to the right, i.e., data stored in the shift register 144[0] can be shifted to the shift register 144[1] and at the same time data stored in the shift register 144[1] is shifted to the shift register 144[2], and so on and so forth. Therefore, the contents of all the shift registers 144[0:n] can be read out bit by bit at a terminal DOUT which is an output of the rightmost shift register 144[n]. Another terminal DIN is connected to an input of the leftmost shift register 144[0]. Data for being written into the electrical fuses 112[0:n] can be shifted into the plurality of shift registers 144[0:n] from left to right through the terminal DIN. The control module 150 takes in the control signals and controls the programming and readout of the plurality of electrical fuses 112[0:n].

Figure 2:
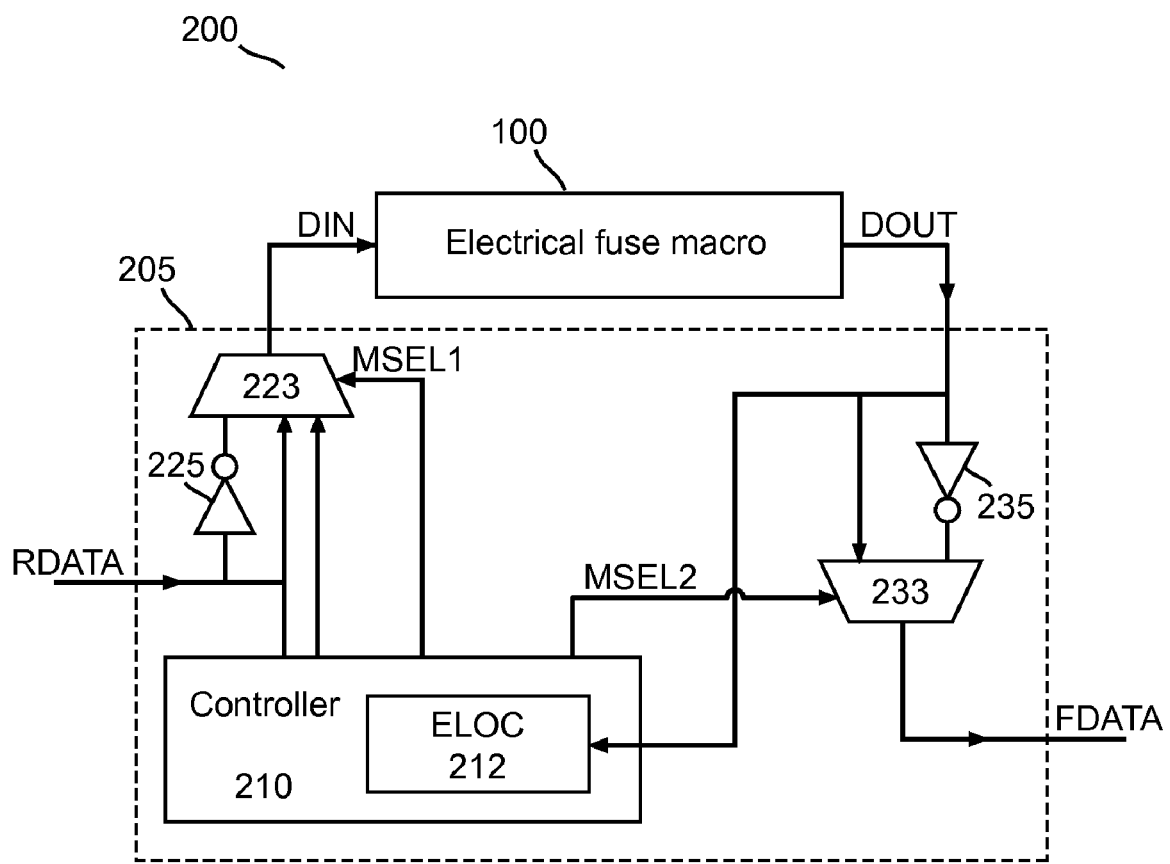
FIG. 2 is a schematic diagram illustrating an electrical fuse circuit having self test and repair functions according to an embodiment of the present invention.

FIG. 2 is a schematic diagram illustrating an electrical fuse circuit 200 having self test and repair functions according to an embodiment of the present invention. The electrical fuse circuit 200 comprises a conventional electrical fuse macro 100 as shown in FIG. 1, and a built-in-self-test module (BIST) 205. The BIST 205 performs the self-test and repair functions on the electrical fuse macro 100 through a controller 210, multiplexers 223 and 233 and inverters 225 and 235. Prior to programming the electrical fuse circuit 200, the controller 210 initiates a test upon power-on of the chip that incorporates the electrical fuse circuit 200, and stores the test result in an error location unit (ELOC) 212. The test result may include a faulty bit's location and whether the faulty bit is a stuck "0" or stuck "1". The "stuck" means that the bit can no long be altered through programming. Given the aforementioned circuit structure, data intended to be stored or "burned" into the electrical fuse macro 100 are not sent directly to the terminal DIN. Instead, the intended data are sent to the terminal DIN through the inverter 225 and the multiplexer 223, i.e., a bit of the intended data can either be inverted or not inverted before being stored in the electrical fuse macro 100. If the terminal DIN takes in inverted data, read-out data will also go through the inverter 235 before it appears at the output terminal FDATA. On the other hand, if the terminal DIN takes in direct (not inverted) data, then the read-out data will go to the output terminal FDATA directly without being inverted. Signals MSEL1 and MSEL2 generated by the controller 210 determine whether or not the intended raw data, RDATA, and the read-out data, FDATA, would go through the inverters 225 and 235, respectively. The controller 210 generates the signals MSEL1 and MSEL2 based on whether or not there is a faulty bit in the electrical fuse macro 100 being detected. Detailed operation will be further described hereinafter.

Figure 3:
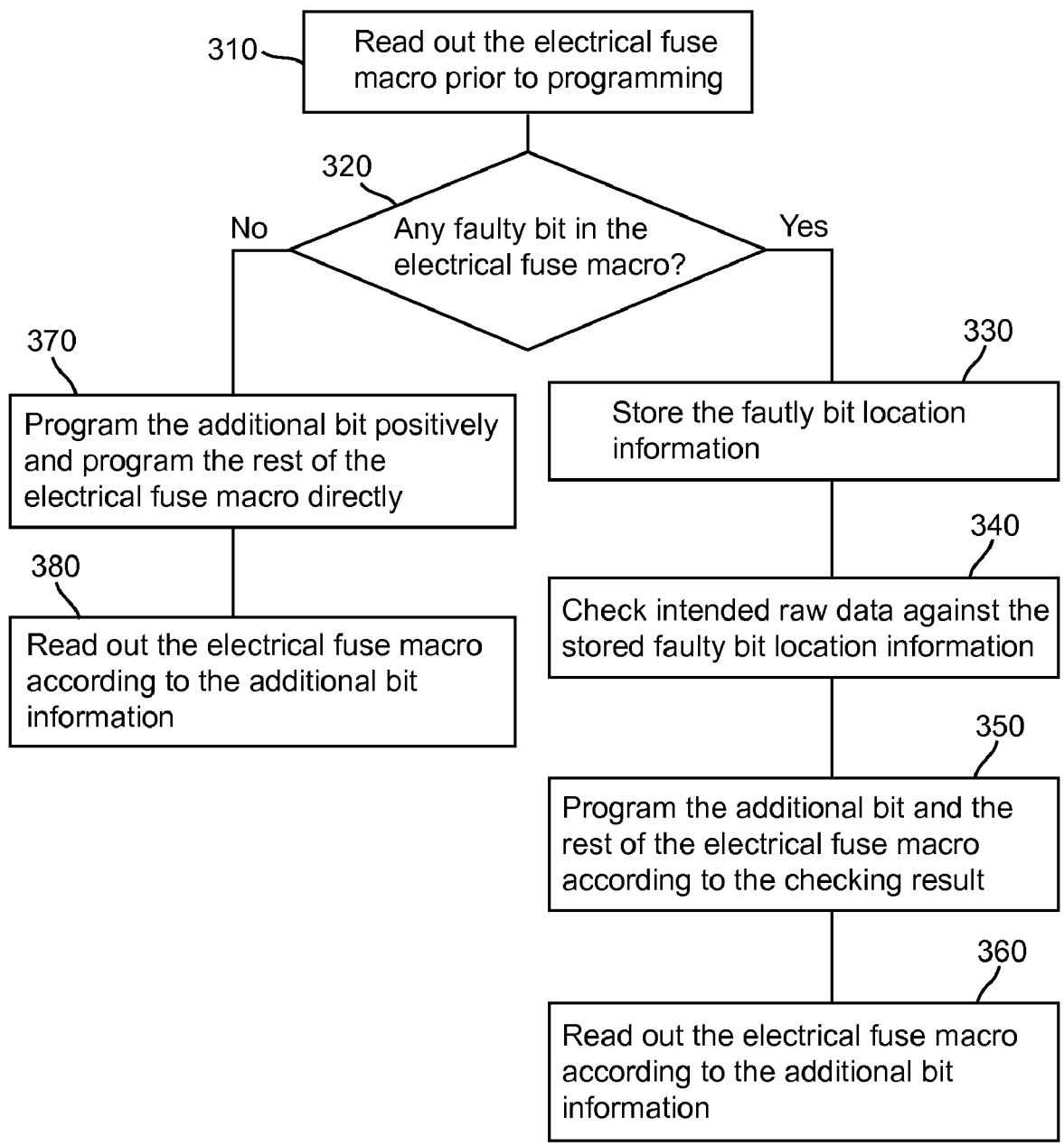
FIG. 3 is a flow chart illustrating a self testing and repairing method employed by the electrical fuse circuit of FIG. 2 according to the embodiment of the present invention.

FIG. 3 is a flow chart illustrating a self testing and repairing method employed by the electrical fuse circuit 200 of FIG. 2 according to the embodiment of the present invention. Referring to both FIGS. 2 and 3, the self testing and repairing method begins with step 310, in which the contents in the electrical fuse macro 100 is read out prior to being programmed. Such reading operation is typically designed to be performed at a chip's power-on.

Step 320 is to detect if there is any faulty bit in the electrical fuse macro 100. For a conventional polysilicon electric fuse, a not-being-programmed one should have a low resistance. If the read-out indicates a high resistance, then the electrical fuse at the corresponding bit is a faulty bit. If the not-being programmed fuse is represented by the logic "0", then the faulty bit is stuck at "1". Alternatively, if the not-being programmed fuse is represented by the logic "1", then the faulty bit is stuck at "0". In step 330, the BIST 205 stores the faulty bit location information in the error location unit 212. In step 340, raw data intended to be stored in the electrical fuse macro 100 is checked against the stored faulty bit location information. The checking also includes comparing the raw data at the faulty bit location with the predetermined stuck "0" or stuck "1" information. In subsequent programming step 350, the raw data may be inverted by the inverter 225 before being programmed into the electrical fuse macro 100 depending on the checking result of step 350. The inverted-or-not information is then stored in an additional bit in the electrical fuse macro. In step 360, reading out of the content of the electrical fuse macro 100 will have to be proceeded by checking the content of the additional bit. If the additional bit indicates that the raw data is inverted before programmed into the electrical fuse macro 100, the output of the electrical fuse macro 100 at the terminal DOUT has to be inverted by the inverter 235 before being read out at the terminal FDATA. If the additional bit indicates that the raw data is programmed directly into the electrical fuse macro 100, the output of the electrical fuse macro 100 at the terminal DOUT will be passed to the terminal FDATA directly without inverting.

Alternatively, if no faulty bit is detected in step 320, raw data will be programmed into the electrical fuse macro 100 directly without being inverted in step 370, and the additional bit is programmed to indicate the fact that the data stored in the electrical fuse macro 100 is not inverted. The subsequent read out of the electrical fuse macro 100 is preceded by checking the additional bit and then read out directly in step 380.

Figure 4A:
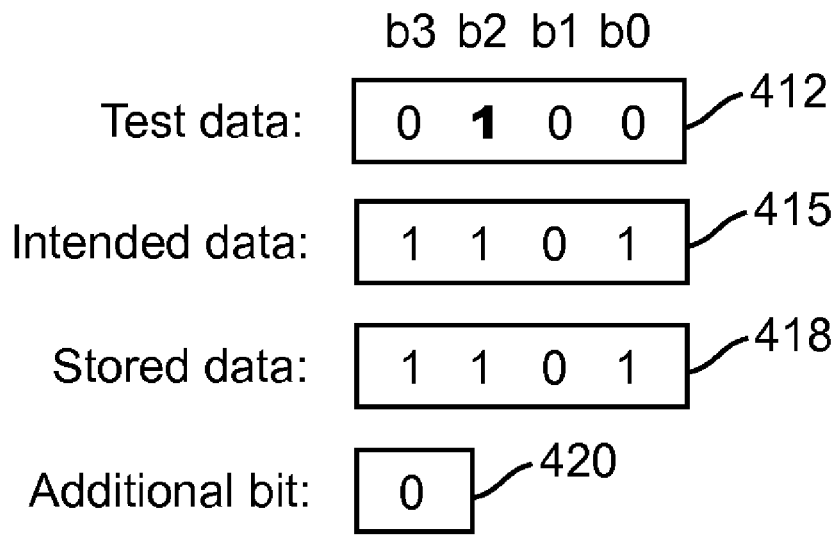
FIGS. 4A and 4B uses two examples to illustrate the flow chart of FIG. 3.
Figure 4B:
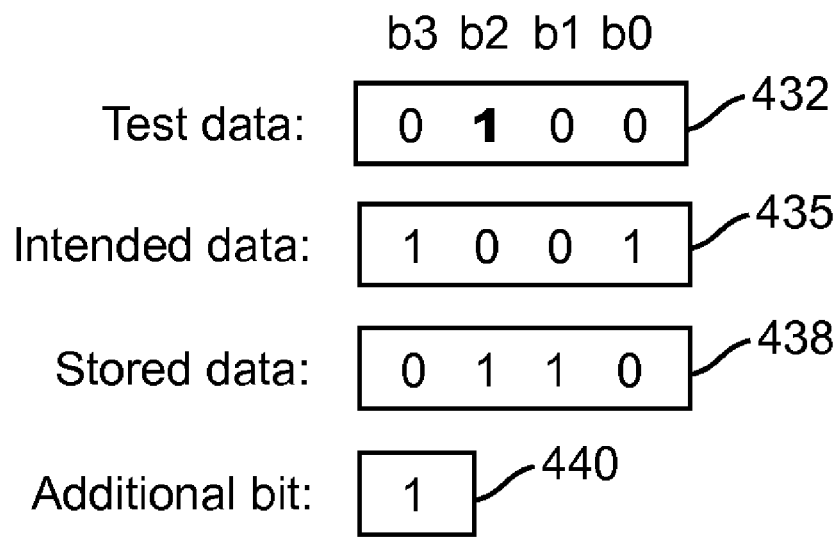

FIGS. 4A and 4B uses two examples to illustrate the steps 310 through 380 shown in FIG. 3. The electrical fuse macros in both examples are of 4 bit wide, b0 through b3. Referring to FIG. 4A, assuming a test data 412 is "0100", i.e., the b2 bit of the test data 412 is stuck at "1". If an intended data 415 happens to have a "1" in b2 bit. Then the stored data 418 is the same as the intended data 415, with an additional bit 420 being programmed to be "0". Before reading out the stored data 418, the additional bit 420 will be checked out first. If the additional bit 420 stores a "0", then the read-out from the stored data will not be inverted, i.e., the intended data 415, the stored data and the read-out data (not shown) will all be the same.

Referring to FIG. 4B, assuming a test data 432 is all "0100", i.e., the b2 bit of the test data 432 is stuck at "1". If an intended data 435 happens to have a "0" in b2 bit then the stored data 438 will be "0110", reversed from the intended data 435 with the additional bit set at "1". Note that after the reversing, the stored data 438 at b2 bit has a "1" to match the stuck at "1" b2 bit of the electrical fuse macro. During reading the electrical fuse macro, the additional bit 440 is checked out first. In this case, since the additional bit 440 stores a "1", the read-out data will all be reversed from the stored data 438, i.e., the read-out data is "1001" which matches the intended data 435. With this reversing scheme, a faulty bit in the electrical fuse macro 100 can be repaired as shown in FIGS. 3, 4A and 4B. An extra for such repair scheme is that an additional bit 420 or 440 needs to be provided to indicate whether the read-out data has to be reversed or not. The additional bit 420 or 440 may be one of the bits in the electrical fuse macro 100, or a different kind of non-volatile storage unit.

Although the present disclosure uses polysilicon based electrical fuses for illustrating the repair scheme, where a faulty fuse may become a stuck "1", one having skills in the art would appreciate that the repair scheme can be applied to other kinds of electrical fuses, for instance a faulty bit may become a stuck "0".

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A circuit for testing and repairing a fuse device having a plurality of fuse units and being able to serially input and output data, the circuit comprising:
   a first multiplexer configured to select either a true or an inverted data for being stored in the fuse device;
   a second multiplexer configured to select either a true or an inverted data being read out from the fuse device;
   a storage unit configured to store information of one or more faulty units of the plurality of the fuse units, and an indication bit being programmed to either a first or second state determined by a comparison between the data intended to be stored in the fuse device and the stored faulty unit information, wherein when the indication bit is at a first state, the first and second multiplexers select the true data, and when the indication bit is at a second state, the first and second multiplexers select the inverted data.

2. The circuit of claim 1 wherein the plurality of fuse units comprises electrically programmable fuses.

3. The circuit of claim 1, wherein the indication bit is an electrically programmable fuse.

4. The circuit of claim 1, wherein the faulty unit information comprises location and logic state information of faulty units of the plurality of fuse units.

5. The circuit of claim 4, wherein the logic state information is a stuck at "1" by a fuse unit.

6. The circuit of claim 1 further comprising a first and second inverter configured to invert input signals for the first and second multiplexer, respectively.

7. The circuit of claim 1 wherein
the data intended to be stored in the plurality of fuse units are serially input to the fuse device through the first multiplexer; and
the data stored in the plurality of fuse units are serially output from the fuse device through the second multiplexer.

8. A circuit for testing and repairing a fuse device having a plurality of fuse units and being able to serially input and output data, the circuit comprising:
a first multiplexer configured to select either a true or an inverted data for being stored in the fuse device;
a first inverter coupled to an input of the first multiplexer for providing the inverted data to the multiplexer;
a second multiplexer configured to select either a true or an inverted data being read out from the fuse device;
a second inverter coupled between an output of the fuse device and an input of the second multiplexer for providing the inverted data to the second multiplexer;
a storage unit configured to store information of one or more faulty units of the plurality of the fuse units, and
an indication bit being programmed to either a first or second state determined by a comparison between the data intended to be stored in the fuse device and the stored faulty unit information,
wherein when the indication bit is at a first state, the first and second multiplexers select the true data, and when the indication bit is at a second state, the first and second multiplexers select the inverted data.

9. The circuit of claim 8 wherein the plurality of fuse units comprises electrically programmable fuses.

10. The circuit of claim 8, wherein the indication bit is an electrically programmable fuse.

11. The circuit of claim 10, wherein the logic state information is a stuck at "1" by a fuse unit.

12. The circuit of claim 8, wherein the faulty unit information comprises location and logic state information of faulty units of the plurality of fuse units.

13. The circuit of claim 8 wherein
the data intended to be stored in the plurality of fuse units are serially input to the fuse device through the first multiplexer; and
the data stored in the plurality of fuse units are serially output from the fuse device through the second multiplexer.

14. A method for testing and repairing a fuse device having a plurality of fuse units and being able to serially input and output data, the method comprising:
detecting any faulty unit among the plurality of fuse units;
storing the faulty unit information if being detected;
comparing a set of data intended to be stored in the plurality of fuse units with the faulty unit information;
programming an indication bit to either a first or a second logic state based on a result of the comparison; and
inverting both data input to the fuse device and data output from the fuse device when the indication bit being programmed to the first logic state and not inverting both data input to the fuse device and data output from the fuse device when the indication bit being programmed to the second logic state.

15. The method of claim 14 wherein the plurality of fuse units comprises electrically programmable fuses.

16. The method of claim 14, wherein the indication bit is an electrically programmable fuse.

17. The method of claim 14, wherein the storing comprises storing location and logic state information of faulty units of the plurality of fuse units.

18. The method of claim 17, wherein the logic state information is a stuck at "1" by a fuse unit.

* * * * *